US012765084B2

(12) United States Patent
Han et al.

(10) Patent No.: US 12,765,084 B2
(45) Date of Patent: Oct. 13, 2026

(54) BACKSIDE ILLUMINATED IMAGE SENSOR

(71) Applicant: DB HITEK CO., LTD., Seoul (KR)

(72) Inventors: Chang Hun Han, Chungcheongbuk-do (KR); Man Lyun Ha, Chungcheongbuk-do (KR); Tae Wook Kang, Chungcheongbuk-do (KR)

(73) Assignee: DB HITEK CO., LTD., Seoul (KR)

( * ) Notice: Subject to any disclaimer, the term of this patent is extended or adjusted under 35 U.S.C. 154(b) by 403 days.

(21) Appl. No.: 18/137,358

(22) Filed: Apr. 20, 2023

(65) Prior Publication Data

US 2024/0222412 A1 Jul. 4, 2024

(30) Foreign Application Priority Data

Jan. 4, 2023 (KR) ........................ 10-2023-0001436

(51) Int. Cl.
*H10F 39/12* (2025.01)
*H10F 39/00* (2025.01)

(52) U.S. Cl.
CPC ....... *H10F 39/199* (2025.01); *H10F 39/8057* (2025.01); *H10F 39/811* (2025.01)

(58) Field of Classification Search
CPC .... H10F 39/199; H10F 39/811; H10F 39/807; H10F 39/8057
See application file for complete search history.

(56) References Cited

U.S. PATENT DOCUMENTS

2015/0255495 A1* 9/2015 Park ...................... H10F 39/014 257/446
2018/0159059 A1* 6/2018 Takemura .............. H04N 23/10
2021/0225918 A1* 7/2021 Lin ....................... H10F 39/014
2023/0005971 A1* 1/2023 Han .................... H10F 39/8063

FOREIGN PATENT DOCUMENTS

KR 1020150105076 9/2015
KR 1020180085090 7/2018
KR 1020220144222 10/2022

OTHER PUBLICATIONS

Office Action issued Feb. 11, 2026, for Korean Application No. 10-2023-0001436, 7 pages.

* cited by examiner

*Primary Examiner* — Ali Naraghi
(74) *Attorney, Agent, or Firm* — Husch Blackwell

(57) ABSTRACT

A backside illuminated image sensor includes a substrate having a frontside surface and a backside surface, pixel regions formed in the substrate, light isolation patterns formed among the pixel regions, first bonding pads electrically connected to the pixel regions, and at least one second bonding pad electrically connected to the light isolation patterns.

7 Claims, 19 Drawing Sheets

BACKSIDE ILLUMINATED IMAGE SENSOR

CROSS-REFERENCE TO RELATED APPLICATION

This application claims the priority benefit of Korean Patent Application No. 10-2023-0001436, filed on Jan. 4, 2023, and all the benefits accruing therefrom under 35 U.S.C. § 119, the contents of which are incorporated by reference in their entirety.

TECHNICAL FIELD

The present disclosure relates to a backside illuminated image sensor. More specifically, the present disclosure relates to a backside illuminated image sensor including a color filter layer and a micro lens array formed on a backside surface of a substrate.

BACKGROUND

In general, an image sensor is a semiconductor device that converts an optical image into electrical signals, and may be classified or categorized as a Charge Coupled Device (CCD) or a Complementary Metal Oxide Semiconductor (CMOS) Image Sensor (CIS).

The CIS includes unit pixels, each including a photodiode and MOS transistors. The CIS sequentially detects the electrical signals of the unit pixels using a switching method, thereby forming an image. The CIS may be classified as either a frontside illuminated image sensor or a backside illuminated image sensor.

The backside illuminated image sensor may include pixel regions formed in a substrate, transistors formed on a frontside surface of the substrate, an insulating layer formed on the transistors, bonding pads on the insulating layer, an anti-reflective layer formed on a backside surface of the substrate, a light blocking pattern formed on the anti-reflective layer, a planarization layer formed on the light blocking pattern, a color filter layer formed on the planarization layer, and a micro lens array formed on the color filter layer.

The light blocking pattern may have openings corresponding to the pixel regions, and may be used to reduce crosstalk of the backside illuminated image sensor. However, when the size of the pixel regions is reduced in order to increase the resolution of the backside illuminated image sensor, the crosstalk of the backside illuminated image sensor may be increased.

Further, the backside illuminated image sensor may include pixel isolation regions formed among the pixel regions. However, dark current may increase due to lattice defects generated at interfaces between the pixel regions and the pixel isolation regions.

SUMMARY

The present disclosure provides a backside illuminated image sensor capable of reducing crosstalk and dark current.

In accordance with an aspect of the present disclosure, a backside illuminated image sensor may include a substrate having a frontside surface and a backside surface, pixel regions formed in the substrate, light isolation patterns formed among the pixel regions, first bonding pads electrically connected to the pixel regions, and at least one second bonding pad electrically connected to the light isolation patterns.

In accordance with some embodiments of the present disclosure, the substrate may have trenches formed among the pixel regions from the backside surface of the substrate toward the frontside surface of the substrate, and the light isolation patterns may be formed in the trenches.

In accordance with some embodiments of the present disclosure, the trenches may be connected with one another and may be arranged in a lattice form.

In accordance with some embodiments of the present disclosure, the light isolation patterns may be connected with one another and may be arranged in a lattice form.

In accordance with some embodiments of the present disclosure, the backside illuminated image sensor may further include an anti-reflective layer formed on the backside surface of the substrate and inner surfaces of the trenches.

In accordance with some embodiments of the present disclosure, the backside illuminated image sensor may further include an insulating layer formed on the frontside surface of the substrate, and electrode pads formed on the insulating layer and electrically connected to the pixel regions. In such case, the first bonding pads may be connected to the electrode pads through via holes penetrating the substrate and the insulating layer.

In accordance with some embodiments of the present disclosure, the backside illuminated image sensor may further include an anti-reflective layer formed on the backside surface of the substrate, and a backside insulating layer formed on the anti-reflective layer, inner side surfaces of the via holes and surface portions of the electrode pads exposed by the via holes. In such case, the first bonding pads may be formed on the backside insulating layer and may be connected to the electrode pads through the backside insulating layer.

In accordance with some embodiments of the present disclosure, the backside illuminated image sensor may further include a light blocking pattern layer having openings corresponding to the pixel regions and formed on the light isolation patterns. In such case, the light isolation patterns may be connected to the at least one second bonding pad through the light blocking pattern layer.

In accordance with some embodiments of the present disclosure, the light isolation patterns may be made of the same material as the light blocking pattern layer.

In accordance with some embodiments of the present disclosure, the backside illuminated image sensor may further include a backside insulating layer formed on the light blocking pattern layer. In such case, the at least one second bonding pad may be formed on the backside insulating layer and may be connected to the light blocking pattern layer through the backside insulating layer.

In accordance with another aspect of the present disclosure, a backside illuminated image sensor may include a substrate having a frontside surface and a backside surface, pixel regions formed in the substrate, light isolation patterns formed among the pixel regions, and bonding pads electrically connected to the pixel regions. Particularly, the light isolation patterns may be electrically connected to at least one of the bonding pads.

In accordance with some embodiments of the present disclosure, the substrate may have trenches formed among the pixel regions from the backside surface of the substrate toward the frontside surface of the substrate, and the light isolation patterns may be formed in the trenches.

In accordance with some embodiments of the present disclosure, the trenches may be connected with one another and may be arranged in a lattice form.

In accordance with some embodiments of the present disclosure, the light isolation patterns may be connected with one another and may be arranged in a lattice form.

In accordance with some embodiments of the present disclosure, the backside illuminated image sensor may further include an anti-reflective layer formed on the backside surface of the substrate and inner surfaces of the trenches.

In accordance with some embodiments of the present disclosure, the backside illuminated image sensor may further include an insulating layer formed on the frontside surface of the substrate, and electrode pads formed on the insulating layer and electrically connected to the pixel regions. In such case, the bonding pads may be connected to the electrode pads through via holes penetrating the substrate and the insulating layer.

In accordance with some embodiments of the present disclosure, the backside illuminated image sensor may further include an anti-reflective layer formed on the backside surface of the substrate, and a backside insulating layer formed on the anti-reflective layer, inner side surfaces of the via holes and surface portions of the electrode pads exposed by the via holes. In such case, the bonding pads may be formed on the backside insulating layer and may be connected to the electrode pads through the backside insulating layer.

In accordance with some embodiments of the present disclosure, the backside illuminated image sensor may further include a light blocking pattern layer having openings corresponding to the pixel regions and formed on the light isolation patterns. In such case, the light isolation patterns may be connected to the at least one of the bonding pads through the light blocking pattern layer.

In accordance with some embodiments of the present disclosure, the backside illuminated image sensor may further include a backside insulating layer formed on the light blocking pattern layer. In such case, the bonding pads may be formed on the backside insulating layer, and the at least one of the bonding pads may be connected to the light blocking pattern layer through the backside insulating layer.

In accordance with some embodiments of the present disclosure, the backside illuminated image sensor may further include a passivation layer formed on the bonding pads and the backside insulating layer.

In accordance with the embodiments of the present disclosure as described above, the light isolation patterns may be configured to surround the pixel regions, thereby significantly reducing leakage of light to adjacent pixel regions and significantly reducing crosstalk of the backside illuminated image sensor. In addition, a negative voltage may be applied to the light isolation patterns through the second bonding pad, and accordingly, dark current of the backside illuminated image sensor may be significantly reduced.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Embodiments can be understood in more detail from the following description taken in conjunction with the accompanying drawings, in which.

Figure 1:
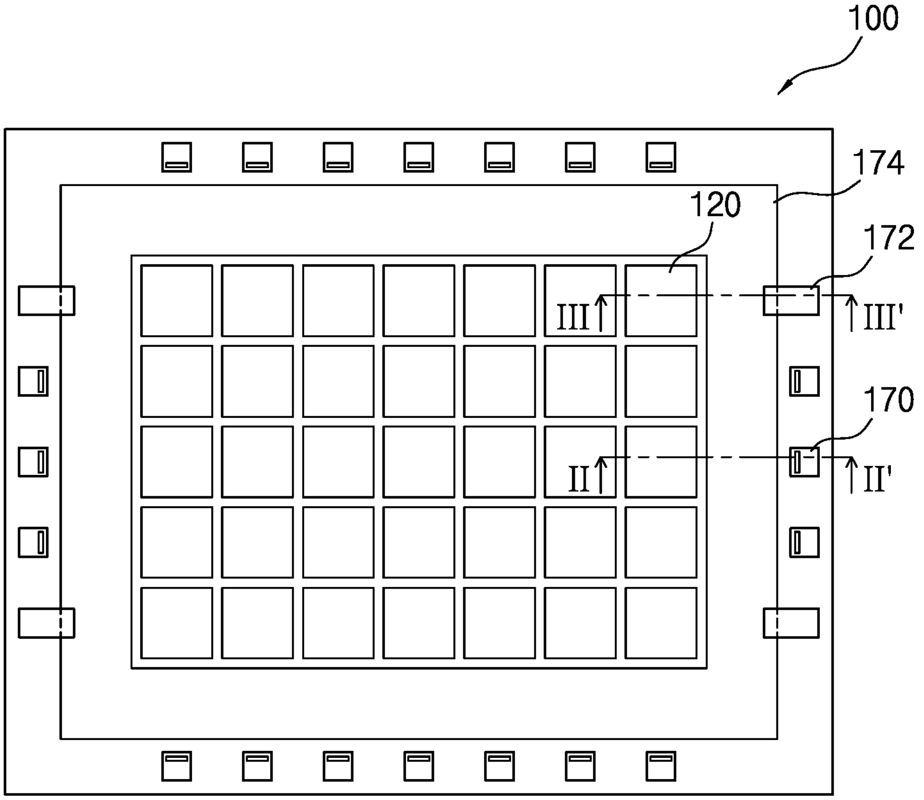
FIG. 1 is a schematic plan view illustrating a backside illuminated image sensor in accordance with an embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present disclosure are described in more detail with reference to the accompanying drawings. However, the present disclosure is not limited to the embodiments described below and is implemented in various other forms. Embodiments below are not provided to fully complete the present disclosure but rather are provided to fully convey the range of the present disclosure to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present disclosure, the regions and the layers are not limited to these terms.

Terminologies used below are used to merely describe specific embodiments, but do not limit the present disclosure. Additionally, unless otherwise defined here, all the terms including technical or scientific terms, may have the same meaning that is generally understood by those skilled in the art.

Embodiments of the present disclosure are described with reference to schematic drawings of ideal embodiments. Accordingly, changes in manufacturing methods and/or allowable errors may be expected from the forms of the drawings. Accordingly, embodiments of the present disclosure are not described being limited to the specific forms or areas in the drawings, and include the deviations of the forms. The areas may be entirely schematic, and their forms may not describe or depict accurate forms or structures in any given area, and are not intended to limit the scope of the present disclosure.

Figure 2:
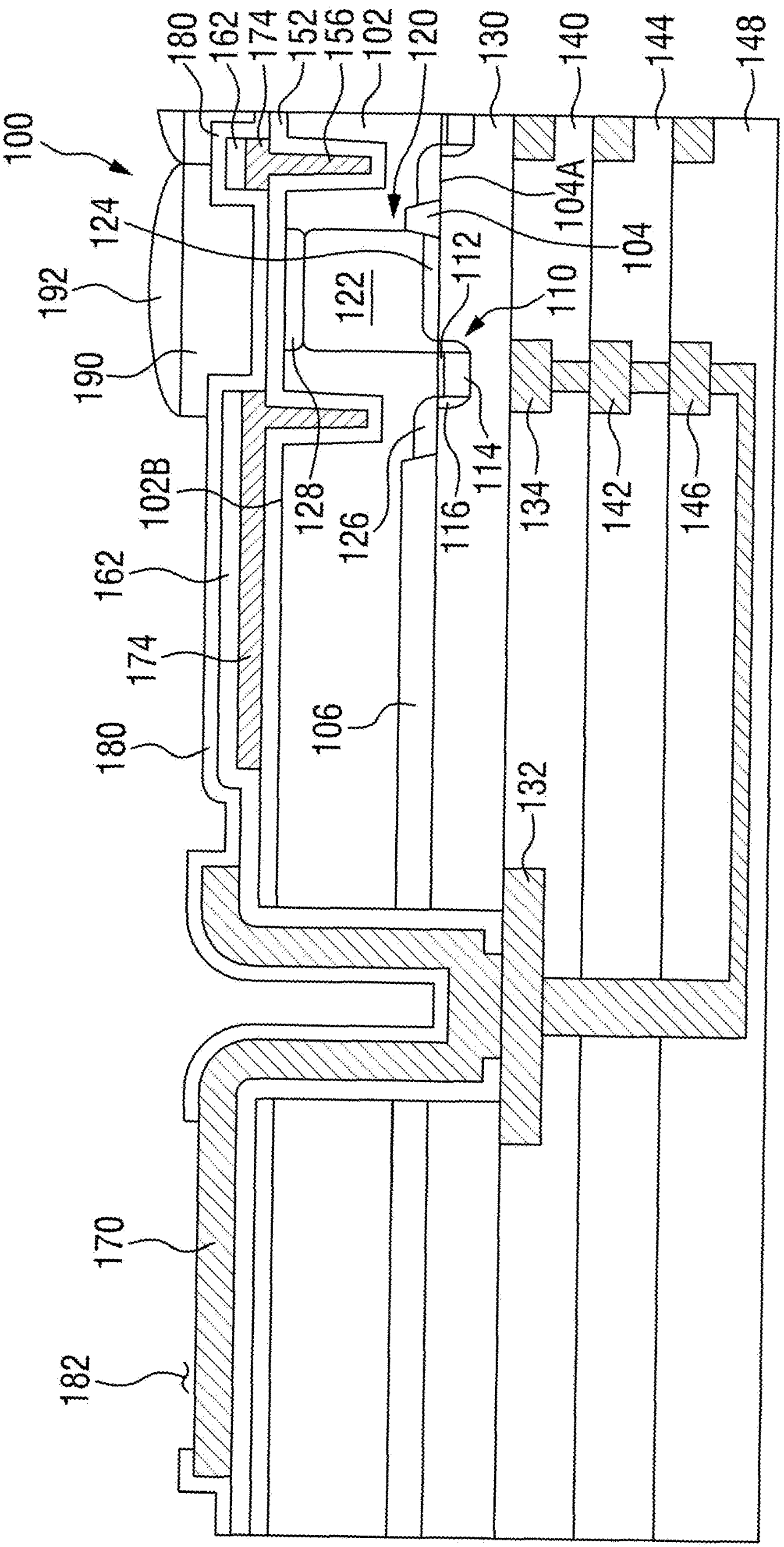
FIG. 2 is a schematic cross-sectional view taken along a line II-II' as shown in FIG. 1.

FIG. 1 is a schematic plan view illustrating a backside illuminated image sensor in accordance with an embodiment of the present disclosure. FIG. 2 is a schematic cross-sectional view taken along a line II-II' as shown in FIG. 1, and FIG. 3 is a schematic cross-sectional view taken along a line III-III' as shown in FIG. 1.

Figure 3:
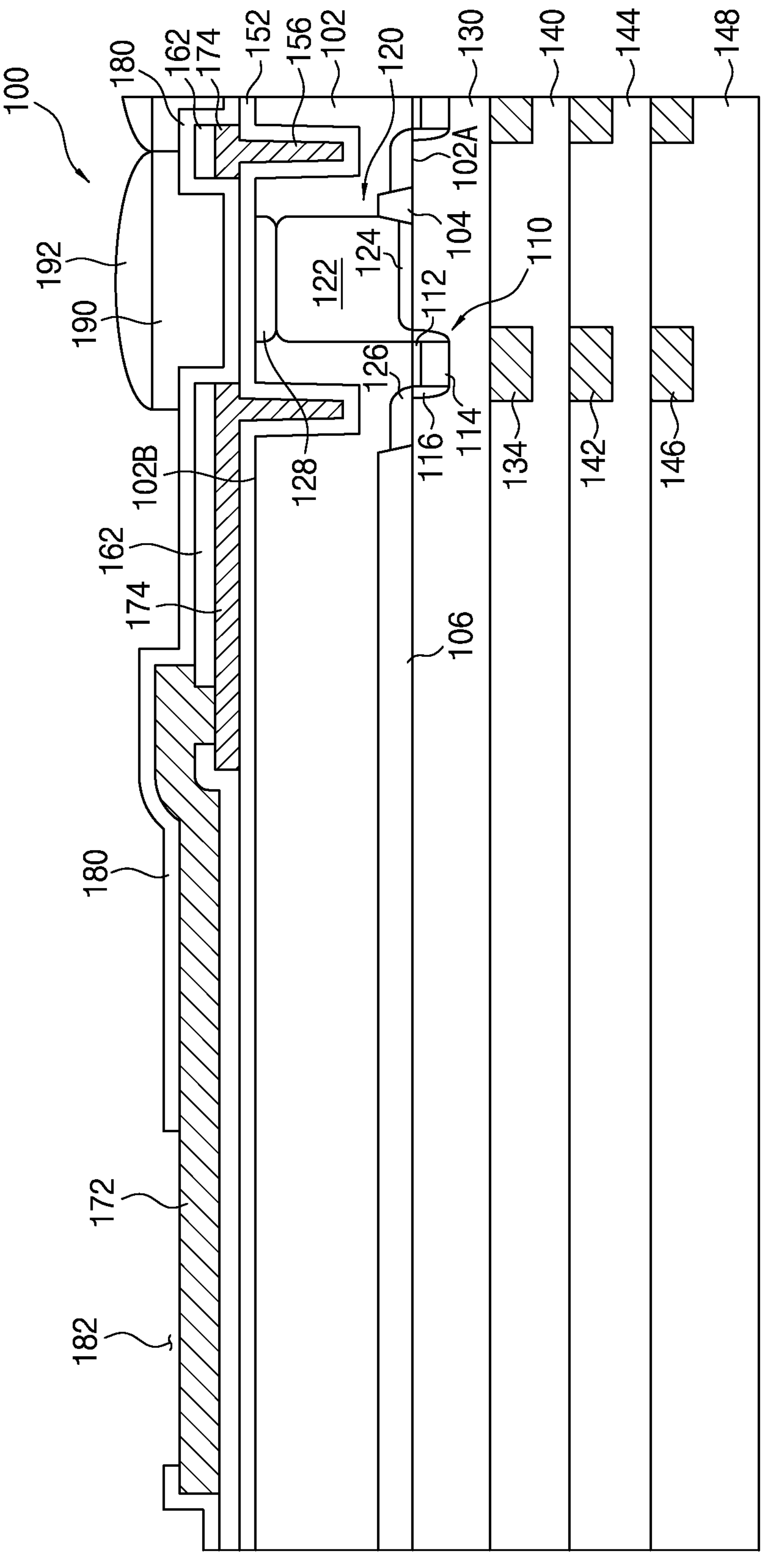
FIG. 3 is a schematic cross-sectional view taken along a line III-III' as shown in FIG. 1.

Referring to FIGS. 1 to 3, a backside illuminated image sensor 100, in accordance with an embodiment of the present disclosure, may include a substrate 102 in which pixel regions 120 are formed. Each of the pixel regions 120 may include a charge accumulation region 122 in which charges generated by the incident light are accumulated. The substrate 102 may have a first conductivity type, and the charge accumulation region 122 may have a second conductivity type. The charge accumulation region 122 may be disposed in the substrate 102, and a floating diffusion region 126 may be disposed in a frontside surface portion of the substrate 102 to be spaced apart from the charge accumulation region 122. The floating diffusion region 126 may have the same conductivity type as the charge accumulation region 122.

For example, a P-type substrate may be used as the substrate 102, and N-type impurity diffusion regions serving as the charge accumulation region 122 and the floating diffusion region 126 may be formed in the P-type substrate 102. As another example, the substrate 102 may include a P-type epitaxial layer. In such case, the charge accumulation region 122 and the floating diffusion region 126 may be formed in the P-type epitaxial layer.

A transfer gate structure 110 may be disposed on a channel region between the charge accumulation region 122 and the floating diffusion region 126 to transfer the charges accumulated in the charge accumulation region 122 to the floating diffusion region 126. The transfer gate structure 110 may include a gate insulating layer 112 disposed on a frontside surface 102A of the substrate 102, a gate electrode 114 disposed on the gate insulating layer 112, and a gate spacer 116 disposed on side surfaces of the gate electrode 114. Further, though not shown in FIGS. 2 and 3, the backside illuminated image sensor 100 may include a reset transistor, a source follower transistor, and a select transistor disposed on the frontside surface 102A of the substrate 102 and electrically connected with the floating diffusion region 126.

Alternatively, if the backside illuminated image sensor 100 is a 3T (or fewer than three transistors) layout, the transfer gate structure 110 may be used as a reset gate structure, and the floating diffusion region 126 may be used as an active region for connecting the charge accumulation region 122 with a reset circuitry.

Each of the pixel regions 120 may include a frontside pinning layer 124 disposed between the frontside surface 102A of the substrate 102 and the charge accumulation region 122. Further, each of the pixel regions 120 may include a backside pinning layer 128 disposed between a backside surface 102B of the substrate 102 and the charge accumulation region 132. The frontside and backside pinning layers 124 and 128 may have the first conductivity type. For example, p-type impurity diffusion regions may be used as the frontside and backside pinning layers 124 and 128.

In accordance with an embodiment of the present disclosure, the backside illuminated image sensor 100 may include a first insulating layer 130 formed on the frontside surface 102A of the substrate 102, and electrode pads 132 formed on a frontside surface of the first insulating layer 130. A first wiring layer 134 electrically connected to the pixel regions 120 may be formed on the frontside surface of the first insulating layer 130, and the electrode pads 132 and the first wiring layer 134 may be made of the same material. For example, the electrode pads 132 and the first wiring layer 134 may be made of aluminum.

The backside illuminated image sensor 100 may include a field isolation region 106 formed in a frontside surface portion of the substrate 102. Specifically, the field isolation region 106 may be formed in a frontside surface portion of a peripheral region of the substrate surrounding the pixel regions 120 and may be made of an insulating material such as silicon oxide. In such case, the first insulating layer 130 may be formed on the frontside surface 102A of the substrate 102 and a frontside surface of the field isolation region 106.

A second insulating layer 140 may be formed on the frontside surface of the first insulating layer 130, the electrode pads 132, and the first wiring layer 134, and a second wiring layer 142 may be formed on the second insulating layer 140. A third insulating layer 144 may be formed on the second insulating layer 140 and the second wiring layer 142, and a third wiring layer 146 may be formed on the third insulating layer 144. In addition, a frontside passivation layer 148 may be formed on the third insulating layer 144 and the third wiring layer 146. The pixel regions 120 may be electrically connected to the electrode pads 132 through the first, second, and third wiring layers 134, 142, and 146.

An anti-reflective layer 152 may be formed on the backside surface 102B of the substrate 102. For example, the anti-reflective layer 152 may include a metal oxide layer formed on the backside surface 102B of the substrate 102. The metal oxide layer may function as a negative fixed charge layer and may include aluminum oxide ($Al_2O_3$), hafnium oxide ($HfO_2$), hafnium aluminum oxide (HfAlO), aluminum oxynitride (AlON), hafnium oxynitride (HfON) or hafnium aluminum oxynitride (HfAlON). In such case, negative charges of the negative fixed charge layer may form a negatively charged shallow minority carrier rich region, i.e., a hole accumulation region, in a backside surface portion of the substrate 102, and thus, a dark current of the backside illuminated image sensor 100 may be reduced. For example, the anti-reflective layer 152 may include an aluminum oxide lay formed on the backside surface 102B of the substrate 102 and a hafnium oxide layer formed on the aluminum oxide layer.

Alternatively, when the charge accumulation region 122 has the first conductivity type, that is, an n-type substrate is used as the substrate 102 and the charge accumulation region 122 include p-type impurities, the metal oxide layer may function as a positive fixed charge layer and may include zirconium oxide ($ZrO_2$), hafnium silicon oxide ($HfSiO_2$), hafnium silicon oxynitride (HfSiON) or silicon nitride ($Si_3N_4$). In such case, the positive fixed charge layer may form an electron accumulation region in a backside surface portion of the substrate 102.

In accordance with an embodiment of the present disclosure, the backside illuminated image sensor 100 may include light isolation patterns 156 formed among the pixel regions 120. Specifically, the backside illuminated image sensor 100 may include light isolation patterns 156 formed to surround the charge accumulation regions 122. For example, the substrate 102 may have trenches 150 (refer to FIG. 8) extending from the backside surface 102B of the substrate 102 toward the frontside surface 102A of the substrate 102 and surrounding the charge accumulation regions 122, and the light isolation patterns 156 may be formed in the trenches 150. In particular, the anti-reflective layer 152 may be uniformly formed to a predetermined thickness on the backside surface 102B of the substrate 102 and inner surfaces of the trenches 150, and the light isolation patterns 156 may be formed on the anti-reflective layer 152 to fill the trenches 150.

The trenches 150 may be connected with one another and may be arranged in a lattice form. The light isolation patterns 156 may be connected with one another in the trenches 150 and may be arranged in a lattice form. In particular, the light isolation patterns 156 are preferably made of a metal material to enable light reflection. Accordingly, leakage of light into the adjacent charge accumulation regions 122 may be prevented, and as a result, crosstalk of the backside illuminated image sensor 100 may be reduced.

A light blocking pattern layer 174 may be formed on the anti-reflective layer 152 and the light isolation patterns 156. For example, the light blocking pattern layer 174 may have first openings 176 (refer to FIG. 18) corresponding to the pixel regions 120, and the light isolation patterns 156 may extend from the light blocking pattern layer 174 toward the frontside surface 102A of the substrate 102. In particular, the light isolation patterns 156 and the light blocking pattern layer 174 may be made of the same material and may be simultaneously formed through a chemical vapor deposition process. For example, the light isolation patterns 156 and the light blocking pattern layer 174 may be made of tungsten.

A backside insulating layer 162 having second openings 178 (refer to FIG. 18) corresponding to the pixel regions 120 may be formed on the anti-reflective layer 152 and the light blocking pattern layer 174. For example, the backside insulating layer 162 may be formed of silicon oxide, and the second openings 178 may have the same size as the first openings 176.

The backside illuminated image sensor 100 may include first bonding pads 170 electrically connected to the pixel regions 120, and one or more second bonding pads 172 electrically connected to the light isolation patterns 156. For example, a plurality of first bonding pads 170 and a plurality of second bonding pads 172 may be formed on the backside insulating layer 162. The first bonding pads 170 may be connected to the electrode pads 132 through the substrate 102, the field isolation region 106, the first insulating layer 130, and the backside insulating layer 162. The second bonding pads 172 may be connected to the light blocking pattern layer 174 through the backside insulating layer 162. For example, the first and second bonding pads 170 and 172 may be made of the same material as the electrode pads 132, such as aluminum.

Specifically, first via holes 160 (refer to FIG. 12) partially exposing the electrode pads 132 may be formed through the anti-reflective layer 152, the substrate 102, the field isolation region 106 and the first insulating layer 130. The backside insulating layer 162 may be formed on the anti-reflective layer 152, inner side surfaces of the first via holes 160, and surface portions of the electrode pads 132 exposed by the first via holes 160. In addition, the backside insulating layer 162 may have second via holes 164 (refer to FIG. 12) exposing surface portions of the electrode pads 132, and the first bonding pads 170 may be formed on the backside insulating layer 162 to fill the second via holes 164.

The backside insulating layer 162 may include third via holes 166 (refer to FIG. 13) partially exposing the light blocking pattern layer 174, and the second bonding pads 172 may be connected to the light blocking pattern layer 174 through the third via holes 166. For example, the second bonding pads 172 may be formed on the backside insulating layer 162 to fill the third via holes 166. In particular, the first via holes 160 may not be formed below the second bonding pads 172. That is, the electrode pads 132 may be disposed to correspond to the first bonding pads 170, and the first via holes 160 and the second via holes 164 may be formed to connect the electrode pads 132 and the first bonding pads 170. Meanwhile, as shown in FIG. 1, although four second bonding pads 172 are used, the number of second bonding pads 172 may be variously changed.

The second bonding pads 172 may be used to apply a negative voltage to the light isolation patterns 156 through the light blocking pattern layer 174. Specifically, when the trenches 150 are formed through an anisotropic etching process, defects such as dangling bonds may occur on inner surfaces of the trenches 150. The defects may function as electron trap sites, and dark current of the backside illuminated image sensor 100 may increase when electrons are trapped in the defects.

In accordance with an embodiment of the present disclosure, the second bonding pads 172 may prevent electrons from being trapped in the defects by applying a negative voltage to the light isolation patterns 156 through the light blocking pattern layer 174, and accordingly, the dark current of the backside illuminated image sensor 100 may be significantly reduced.

A passivation layer 180 may be formed on the backside insulating layer 162, inner surfaces of the first and second openings 176 and 178, and the first and second bonding pads 170 and 172. For example, the passivation layer 180 may include silicon oxide and may have third openings 182 exposing portions of the first and second bonding pads 170 and 172. Although not shown in figures, solder bumps (not shown) may be formed on the portions of the first and second bonding pads 170 and 172 exposed by the third openings 182. Alternatively, wires (not shown) may be bonded on the portions of the first and second bonding pads 170 and 172 exposed by the third openings 182 through a wire bonding process.

A color filter layer 190 and a microlens array 192 may be sequentially formed on the passivation layer 180. The color filter layer 190 may include red filters, green filters, and blue filters. The filters may be formed by forming a photoresist layer having a color on the passivation layer 180 through a spin coating process and then performing a photolithography process.

Figure 4:
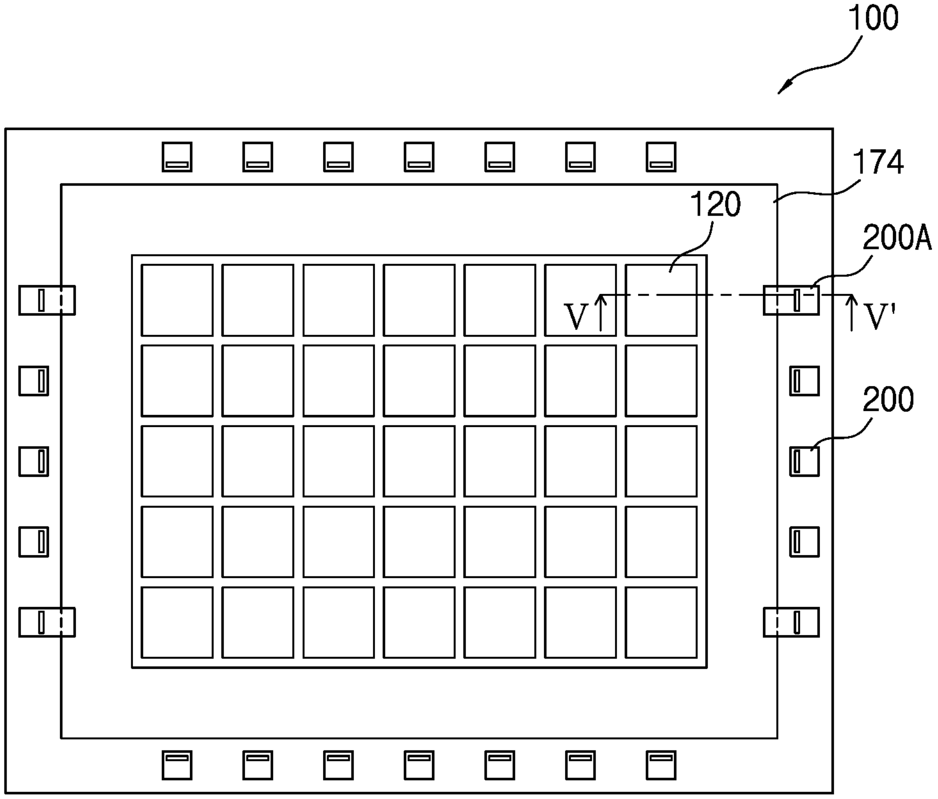
FIG. 4 is a schematic plan view illustrating a backside illuminated image sensor in accordance with another embodiment of the present disclosure.
Figure 5:
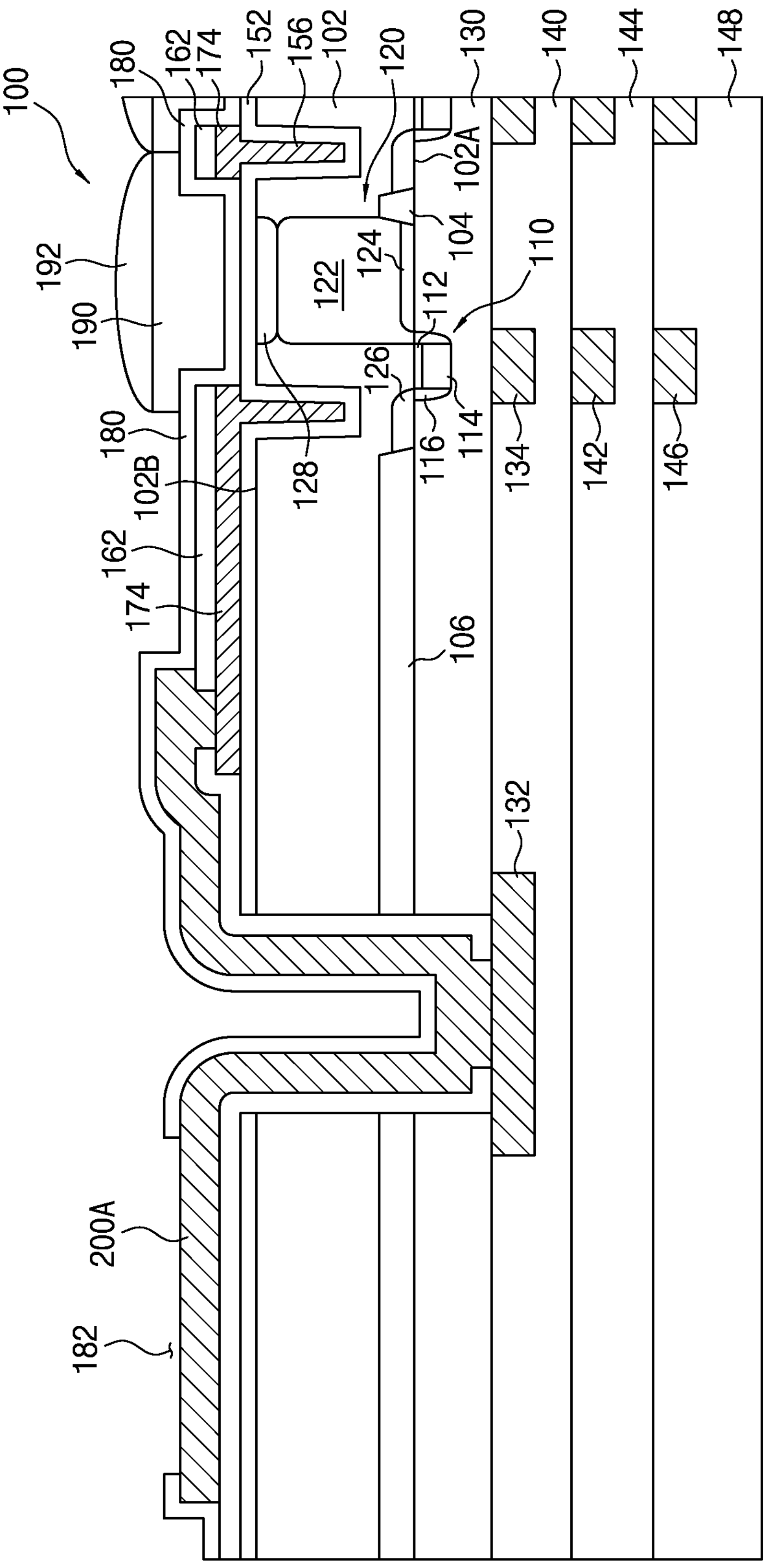
FIG. 5 is a schematic cross-sectional view taken along a line V-V' as shown in FIG. 4.

FIG. 4 is a schematic plan view illustrating a backside illuminated image sensor in accordance with another embodiment of the present disclosure, and FIG. 5 is a schematic cross-sectional view taken along a line V-V as shown in FIG. 4.

Referring to FIGS. 4 and 5, an image sensor 100, in accordance with another embodiment of the present disclosure, may include a substrate 102 having a frontside surface 102A and a backside surface 102B, pixel regions 120 formed in the substrate 102, light isolation patterns 156 formed among the pixel regions 120, and bonding pads 200 electrically connected to the pixel regions 120. Particularly, the light isolation patterns 156 may be electrically connected to one or more bonding pads 200A of the bonding pads 200. For example, as shown in FIG. 4, the light isolation patterns 156 may be connected to four bonding pads 200A. However, the number of bonding pads 200A connected to the light isolation patterns 156 may be changed, and thus, the scope of the present disclosure may not be limited thereby.

The bonding pads 200 may be electrically connected to the pixel regions 120 through electrode pads 132 formed on the frontside surface 102A of the substrate 102. In accordance with another embodiment of the present disclosure, other components except for the bonding pads 200A electrically connected to the light isolation patterns 156 are substantially the same as those described above with reference to FIGS. 1 to 3, so additional detailed descriptions thereof are omitted. In particular, bonding pads 200 not connected to the light isolation patterns 156 may have substantially the same configuration as the first bonding pads 170 previously described with reference to FIG. 2.

Referring to FIG. 5, some bonding pads 200A may be connected to the light isolation patterns 156 in the same way as the second bonding pads 172 shown in FIG. 3. Specifically, a light blocking pattern layer 174 may be formed on the light isolation patterns 156, and a backside insulating layer 162 may be formed on the light blocking pattern layer 174. The bonding pads 200 may be formed on the backside insulating layer 162, and some bonding pads 200A may be connected to the light blocking pattern layer 174 through the back insulating layer 162.

FIGS. 6 to 19 are schematic cross-sectional views illustrating a method of manufacturing the backside illuminated image sensor as shown in FIGS. 1 to 3.

Figure 6:
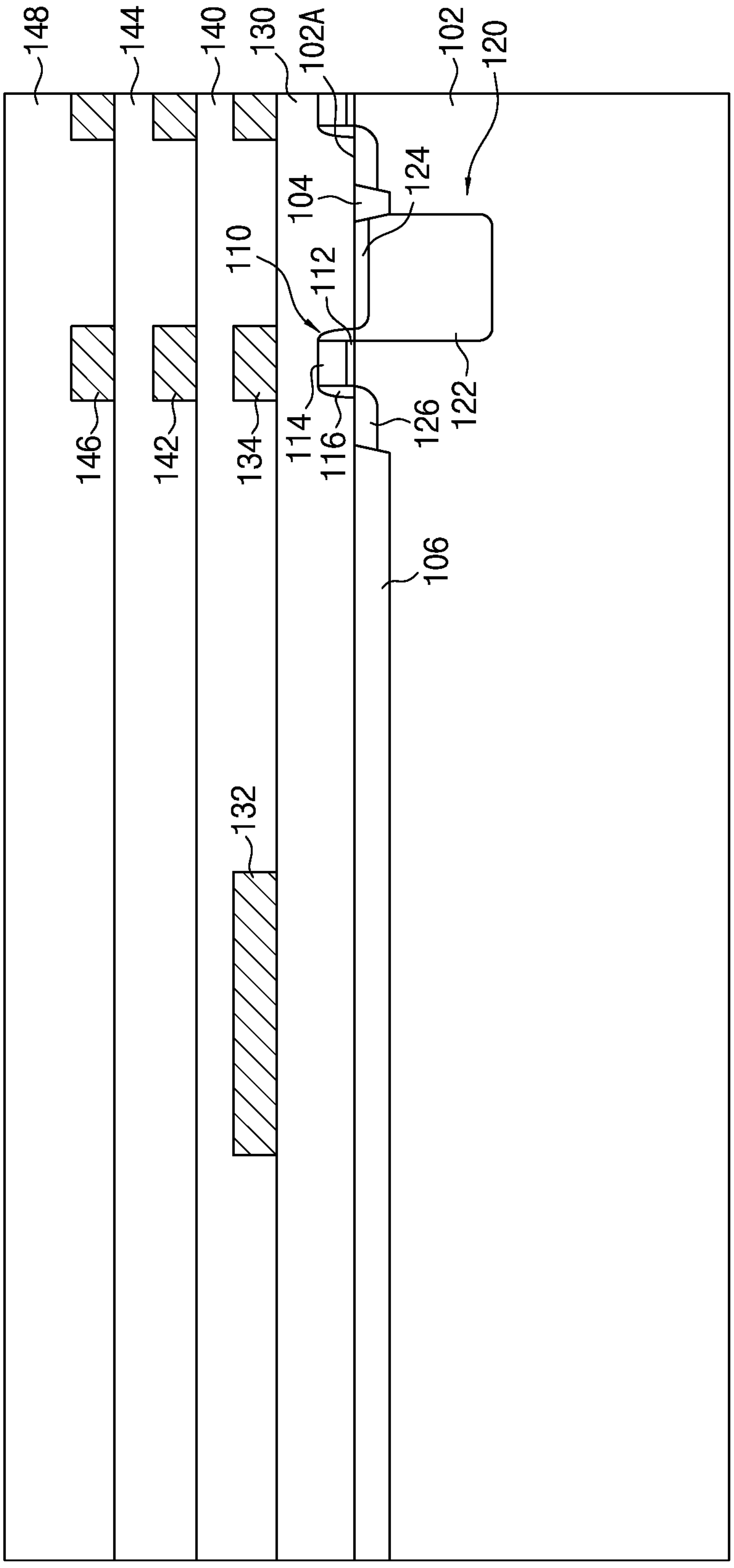
FIGS. 6 to 19 are schematic cross-sectional views illustrating a method of manufacturing the backside illuminated image sensor as shown in FIGS. 1 to 3.

Referring to FIG. 6, device isolation regions 104 may be formed in frontside surface portions of a substrate 102 to define active regions of a backside illuminated image sensor 100. The substrate 102 may have a first conductivity type. For example, a p-type substrate may be used as the substrate 102. Alternatively, the substrate 102 may include a bulk silicon substrate and a p-type epitaxial layer formed on the bulk silicon substrate. The device isolation regions 104 may be made of silicon oxide and may be formed through a shallow trench isolation (STI) process. Further, a field isolation region 106 may be formed in a frontside surface portion of a peripheral region of the substrate 102 surrounding the active regions. For example, the field isolation region 106 may be formed simultaneously with the device isolation regions 104.

After forming the device isolation regions 104 and the field isolation region 106, transfer gate structures 110 may be formed on a frontside surface 102A of the substrate 102. Each of the transfer gate structures 110 may include a gate insulating layer 112, a gate electrode 114 formed on the gate insulating layer 112 and a gate spacer 116 formed on side surfaces of the gate electrode 114. Further, though not shown in figures, reset gate structures, source follower gate structures and select gate structures may be simultaneously formed with the transfer gate structures 110 on the frontside surface 102A of the substrate 102.

Charge accumulation regions 122 may be formed in the substrate 102. Specifically, charge accumulation regions 122 having a second conductivity type may be formed in the active regions of the substrate 102. For example, n-type charge accumulation regions 122 may be formed in the p-type substrate 102. The n-type charge accumulation regions 122 may be n-type impurity diffusion regions formed by an ion implantation process.

Frontside pinning layers 124 having the first conductivity type may be formed between the frontside surface 102A of the substrate 102 and the charge accumulation regions 122. For example, p-type frontside pinning layers 124 may be formed between the frontside surface 102A of the substrate 102 and the n-type charge accumulation regions 122 by an ion implantation process. The p-type frontside pinning layers 124 may be p-type impurity diffusion regions. The n-type charge accumulation regions 122 and the p-type frontside pinning layers 124 may be activated by a subsequent rapid heat treatment process.

Floating diffusion regions 126 having the second conductivity type may be formed in frontside surface portions of the substrate 102 to be spaced apart from the charge accumulation regions 122. For example, the floating diffusion regions 126 may be n-type high concentration impurity regions, which may be formed by an ion implantation process. At this time, the transfer gate structures 110 may be arranged on channel regions between the charge accumulation regions 122 and the floating diffusion regions 126.

After forming a plurality of pixel regions 120 as described above, a first insulating layer 130 made of an insulating material such as silicon oxide may be formed on the frontside surface 102A of the substrate 102. Electrode pads 132 and a first wiring layer 134 electrically connected to the pixel regions 120 may be formed on the frontside surface of the first insulating layer 130. For example, the electrode pads 132 and the first wiring layer 134 may be formed by forming a metal layer such as an aluminum layer on the first insulating layer 130 and then patterning the metal layer.

Further, a second insulating layer 140 may be formed on the first insulating layer 130, the electrode pads 132, and the first wiring layer 134, and a second wiring layer 142 may be formed on the second insulating layer 140. A third insulating layer 144 may be formed on the second insulating layer 140 and the second wiring layer 142, and a third wiring layer 146 may be formed on the third insulating layer 144. A frontside passivation layer 148 may be formed on the third insulating layer 144 and the third wiring layer 146. The first, second, and third wiring layers 134, 142, and 146 may be electrically connected to the pixel regions 120, and the electrode pads 132 may be electrically connected to the first, second, and third wiring layers 134, 142, and 146.

Figure 7:
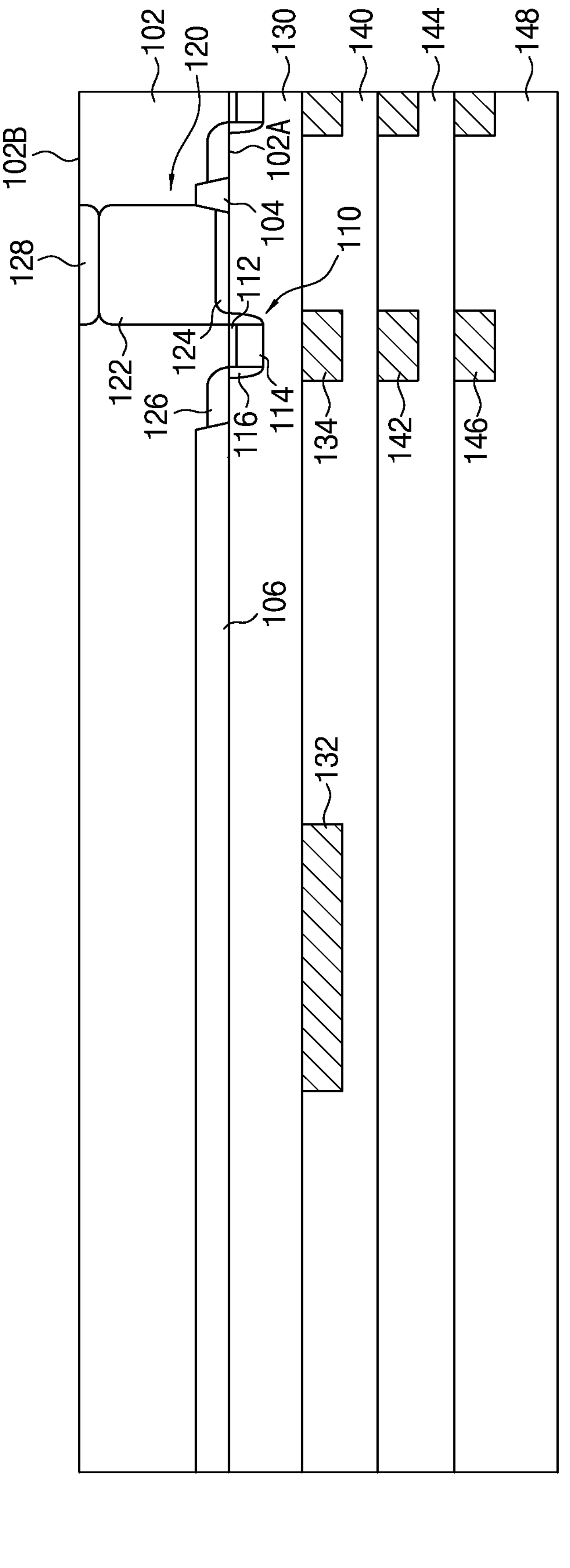

Referring to FIG. 7, a back-grinding process or a chemical and mechanical polishing process may be performed in order to reduce a thickness of the substrate 102. Further, backside pinning layers 128 having the first conductivity type may be formed between a backside surface 102B of the substrate 102 and the charge accumulation regions 122. For example, as shown in FIG. 7, after inverting the substrate 102 so that the backside surface 102B of the substrate 102 faces upward, p-type backside pinning layers 128 may be formed between the backside surface 102B of the substrate 102 and the charge accumulation regions 122 through an ion implantation process. In such case, the p-type backside pinning layers 128 may be activated through a laser annealing process.

Alternatively, the backside pinning layers 128 may be formed prior to the charge accumulation regions 122. For example, after forming the backside pinning layers 128, the charge accumulation regions 122 may be formed on the backside pinning layers 128, and the frontside pinning layers 124 may then be formed on the charge accumulation regions 122. In such case, the backside pinning layers 128 may be activated by the rapid heat treatment process along with the charge accumulation regions 122 and the frontside pinning layers 124. Further, the back-grinding process may be performed such that the backside pinning layers 128 are exposed.

As another example, when the substrate 102 includes a bulk silicon substrate and a p-type epitaxial layer formed on the bulk silicon substrate, the charge accumulation regions 122 and the frontside and backside pinning layers 124 and 128 may be formed in the p-type epitaxial layer, and the bulk silicon substrate may be removed by the back-grinding process.

Figure 8:
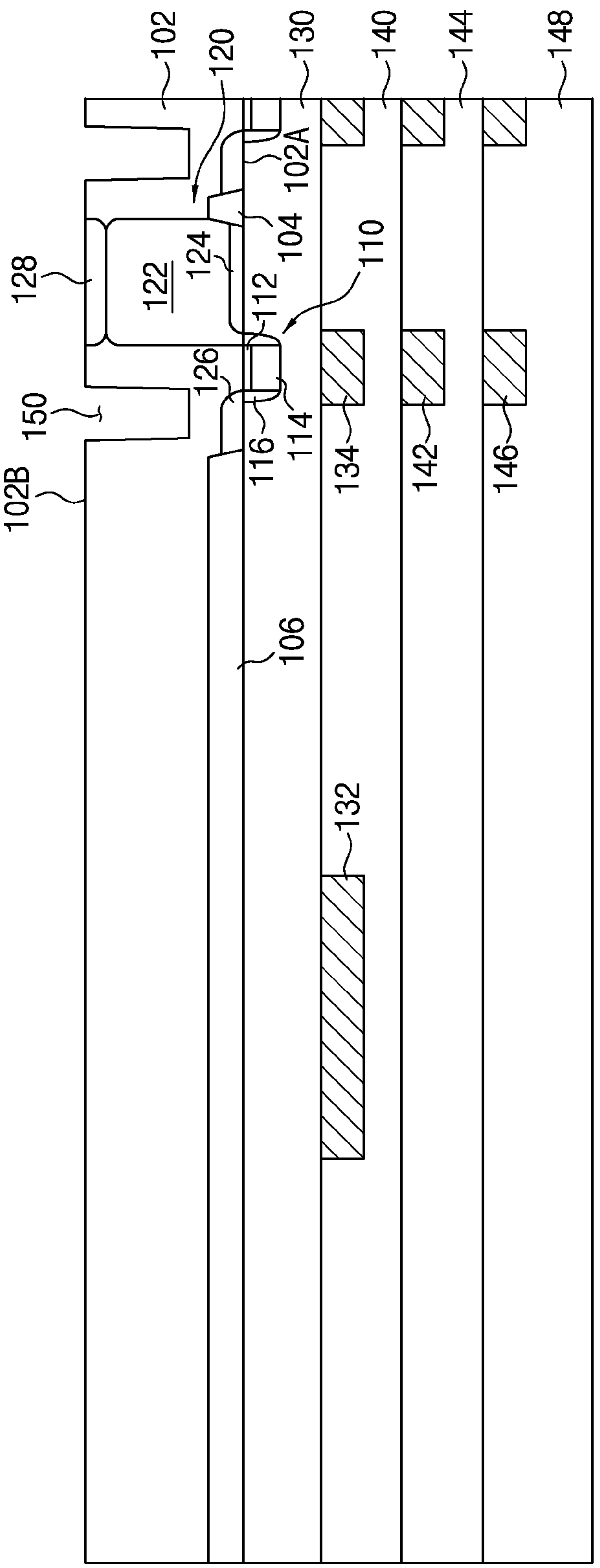

Referring to FIG. 8, trenches 150 may be formed among the pixel regions 120 by partially removing the substrate 102. Specifically, the trenches 150 may be formed to extend from the backside surface 102B of the substrate 102 toward the frontside surface 102A of the substrate 102. In particular, the trenches 150 may be connected with one another and may have a lattice shape, whereby the charge accumulation regions 122 may be surrounded by the trenches 150. For example, a first photoresist pattern (not shown) having openings corresponding to the trenches 150 may be formed on the backside surface 102B of the substrate 102. Then, the trenches 150 may be formed by performing an anisotropic etching process using the first photoresist pattern as an etching mask. The first photoresist pattern may be removed by an ashing process and/or a strip process after forming the trench 150.

Figure 9:
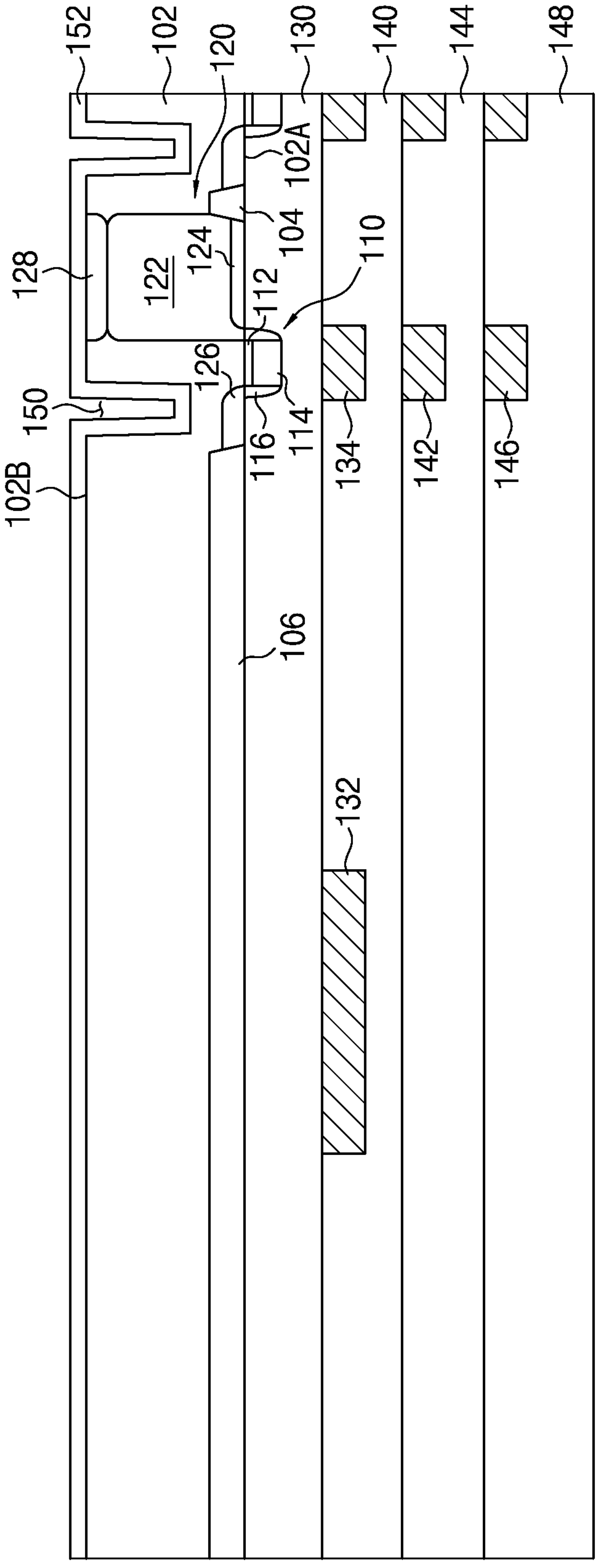

Referring to FIG. 9, an anti-reflective layer 152 may be formed to a predetermined thickness on the backside surface 102B of the substrate 102 and inner surfaces of the trenches 150. For example, the anti-reflective layer 152 may include an aluminum oxide layer formed on the backside surface 102B of the substrate 102 and the inner surfaces of the trenches 150, and a hafnium oxide layer formed on the aluminum oxide layer. The aluminum oxide layer and the hafnium oxide layer may be formed through an atomic layer deposition process to have a constant thickness.

Figure 10:
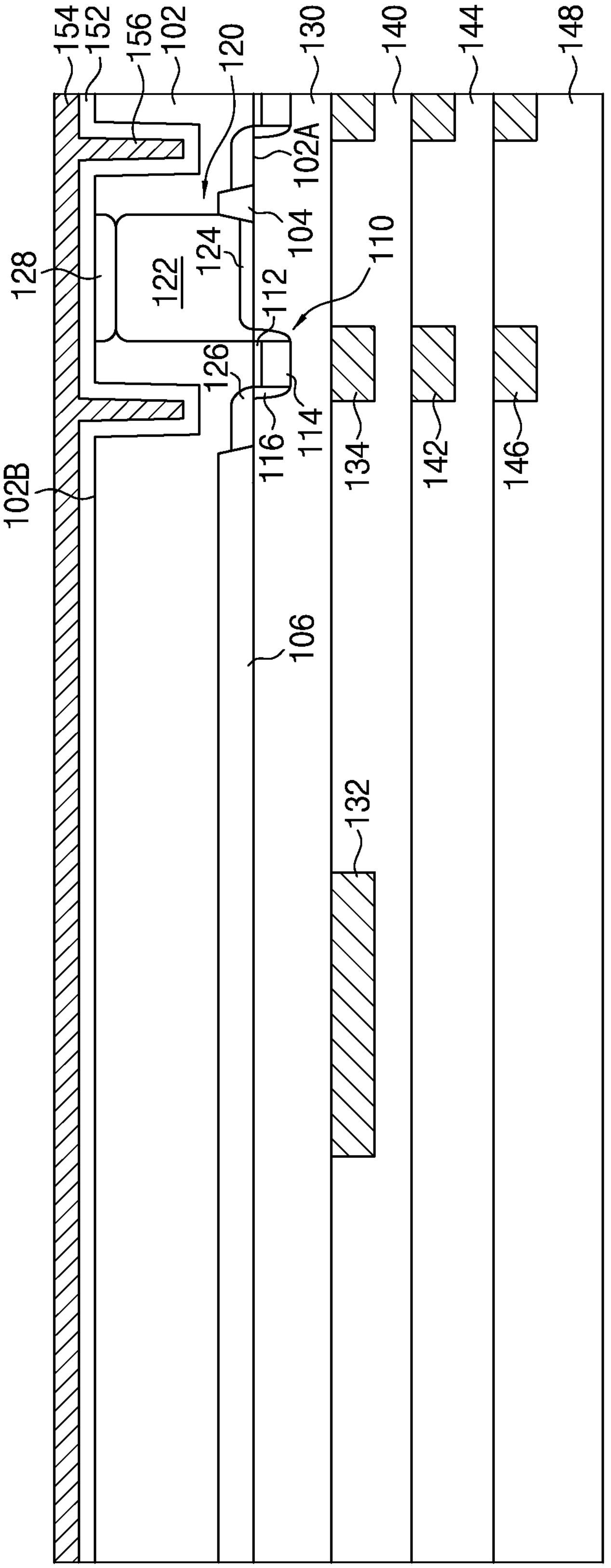

Referring to FIG. 10, a first metal layer 154 may be formed on the first anti-reflective layer 152. In particular, the first metal layer 154 may be formed to sufficiently fill the trenches 150, and accordingly, light isolation patterns 156 surrounding the charge accumulation regions 122 may be formed in the trenches 150. For example, a tungsten layer 154 may be formed on the anti-reflective layer 152 through a chemical vapor deposition process, and accordingly, light isolation patterns 156 made of tungsten may be formed in the trenches 150.

Figure 11:
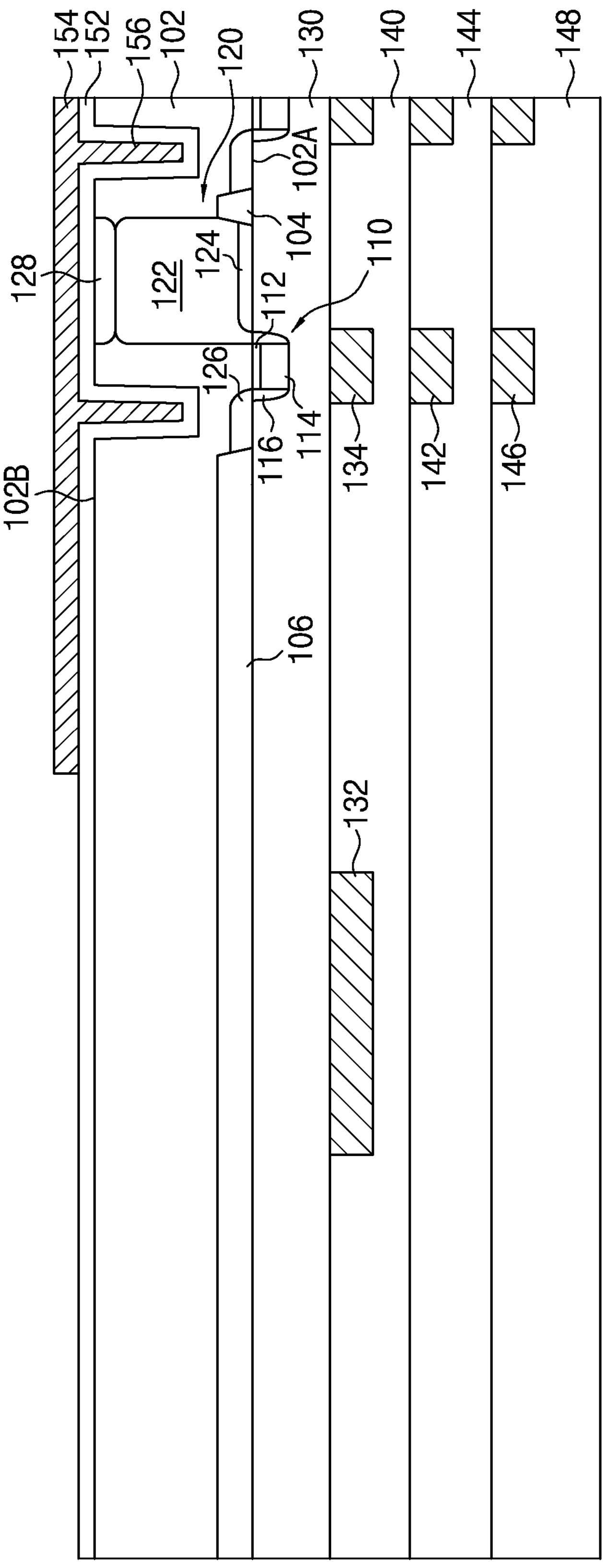

Referring to FIG. 11, an edge portion of the anti-reflective layer 152 may be exposed by removing an edge portion of the first metal layer 154. For example, after forming a second photoresist pattern (not shown) exposing the edge portion of the first metal layer 154 on the first metal layer 154, the edge portion of the anti-reflective layer 152 may be exposed by performing an anisotropic etching process using the second photoresist pattern as an etching mask. The second photoresist pattern may be removed by an ashing process and/or a stripping process after removing an edge portion of the first metal layer 154.

Figure 12:
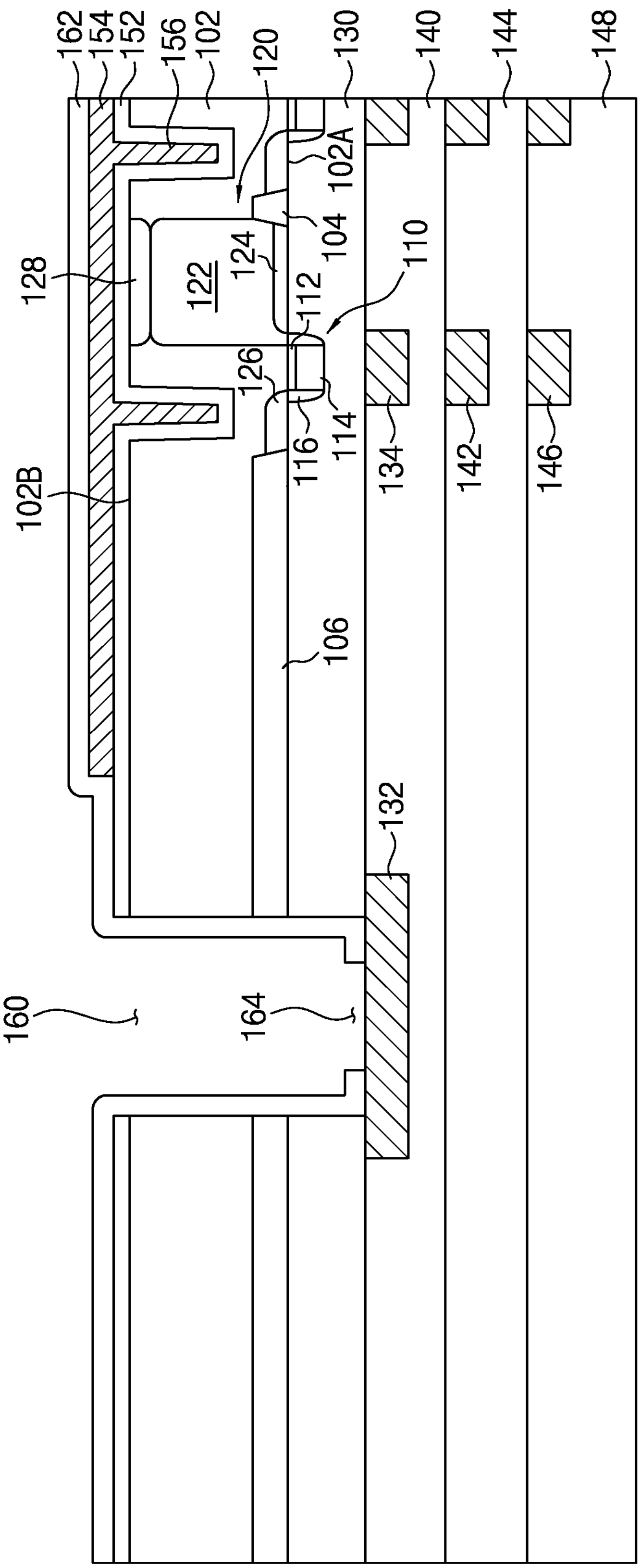

Referring to FIG. 12, first via holes 160 exposing portions of the electrode pads 132 may be formed by partially removing the anti-reflective layer 152, the substrate 102, the field isolation region 106, and the first insulating layer 130. For example, after forming a third photoresist pattern (not shown) exposing portions of the anti-reflective layer 152 where the first via holes 160 are to be formed on the anti-reflective layer 152 and the first metal layer 154, an anisotropic etching process using the third photoresist pattern as an etching mask may be performed so as to form first via holes 160 exposing portions of the electrode pads 132 through the anti-reflective layer 152, the substrate 102, the field isolation region 106, and the first insulating layer 130. The third photoresist pattern may be removed by an ashing process and/or a stripping process after forming the first via holes 160.

A backside insulating layer 162 may be formed on the anti-reflective layer 152, the first metal layer 154, inner side surfaces of the first via holes 160, and the exposed portions of the electrode pads 132. For example, the backside insulating layer 162 may include silicon oxide and may be formed to a predetermined thickness through a chemical vapor deposition process.

The backside insulating layer 162 may be partially removed to form second via holes 164 exposing surface portions of the electrode pads 132. For example, after forming a fourth photoresist pattern (not shown) exposing regions where the second via holes 164 are to be formed on the backside insulating layer 162, an etching process using the fourth photoresist pattern as an etching mask may be performed so as to form second via holes 164 exposing portions of the electrode pads 132 through the backside insulating layer 162.

Figure 13:
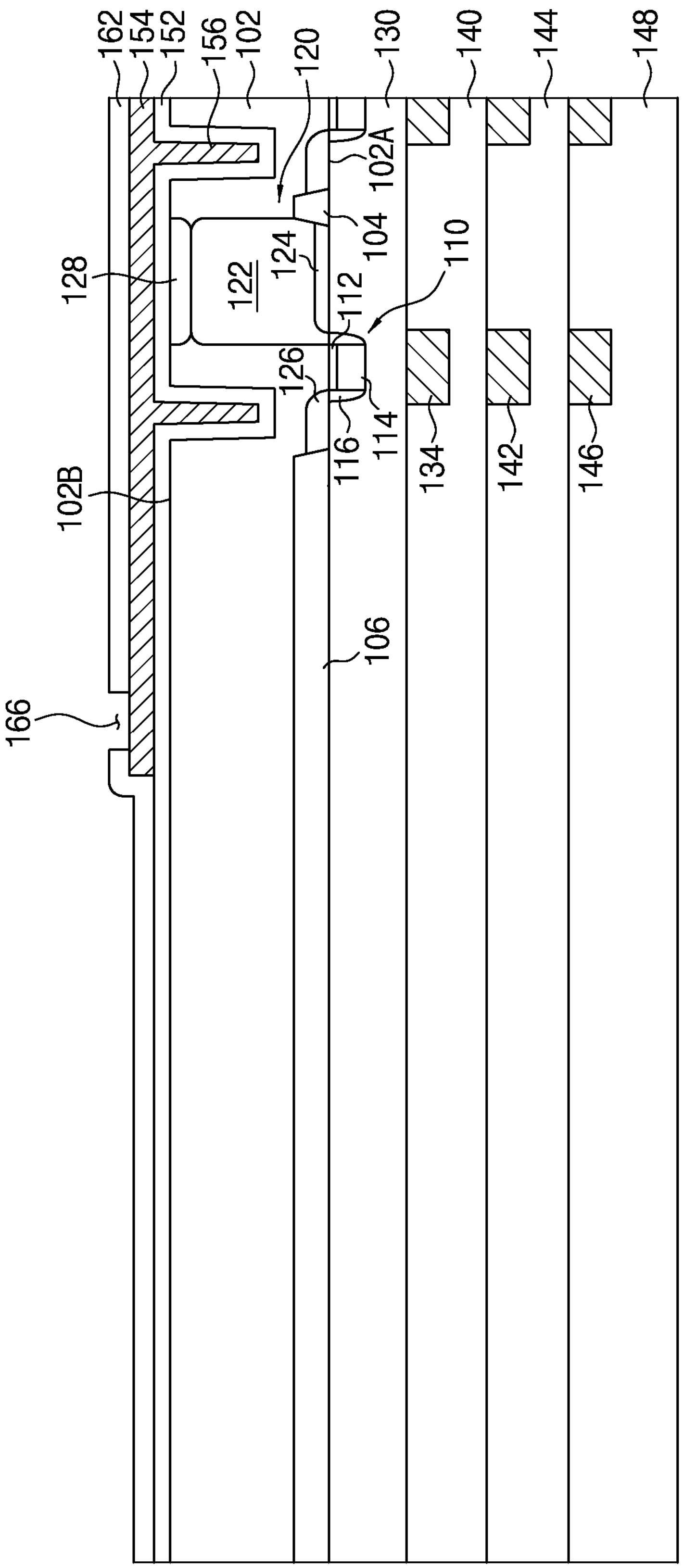

Referring to FIG. 13, the first via holes 160 and the second via holes 164 may not be formed in regions where second bonding pads 172 (refer to FIGS. 1 and 3) are to be formed, and third via holes 166 exposing surface portions of the first metal layer 154 may be formed through the backside insulating layer 162. The third via holes 166 may be formed simultaneously with the second via holes 164. In such case, the fourth photoresist pattern may have openings for forming the second and third via holes 164 and 166. The fourth photoresist pattern may be removed by an ashing process and/or a strip process after forming the second and third via holes 164 and 166.

Figure 14:
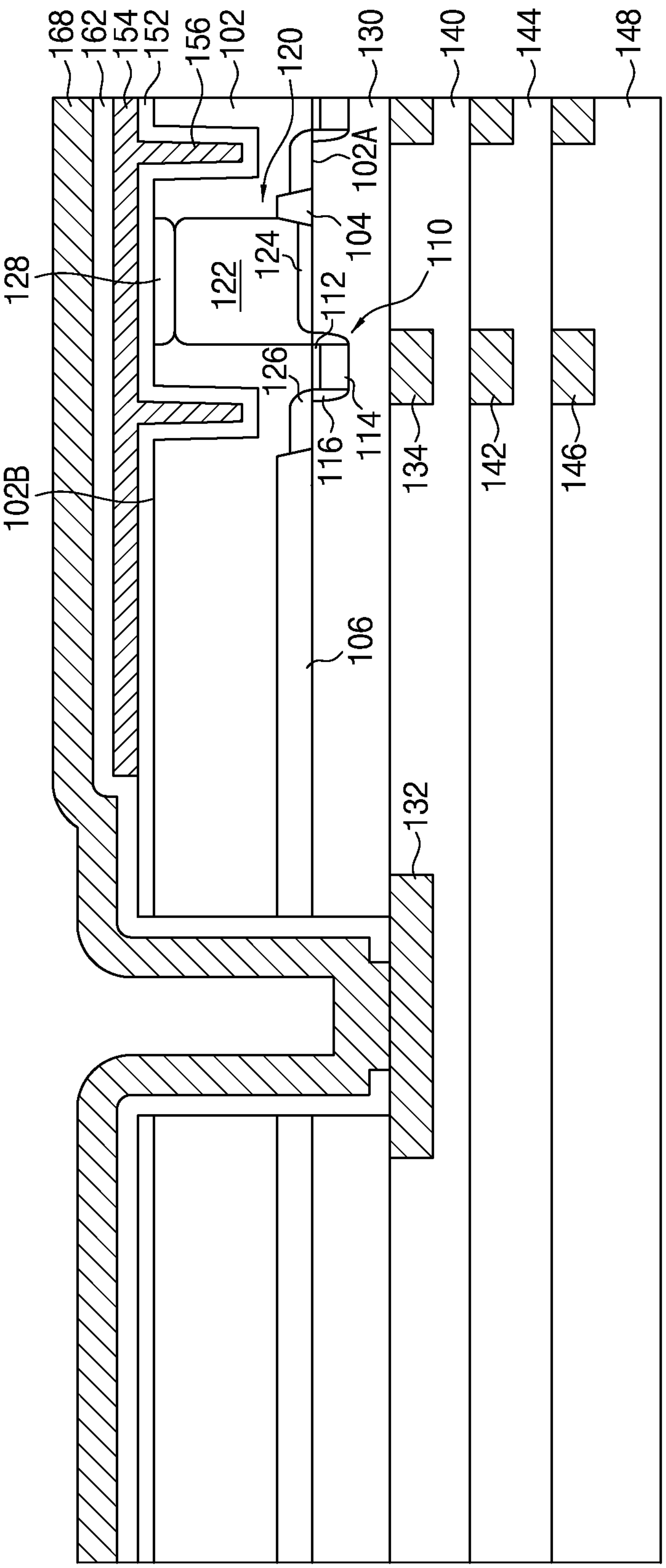
Figure 15:
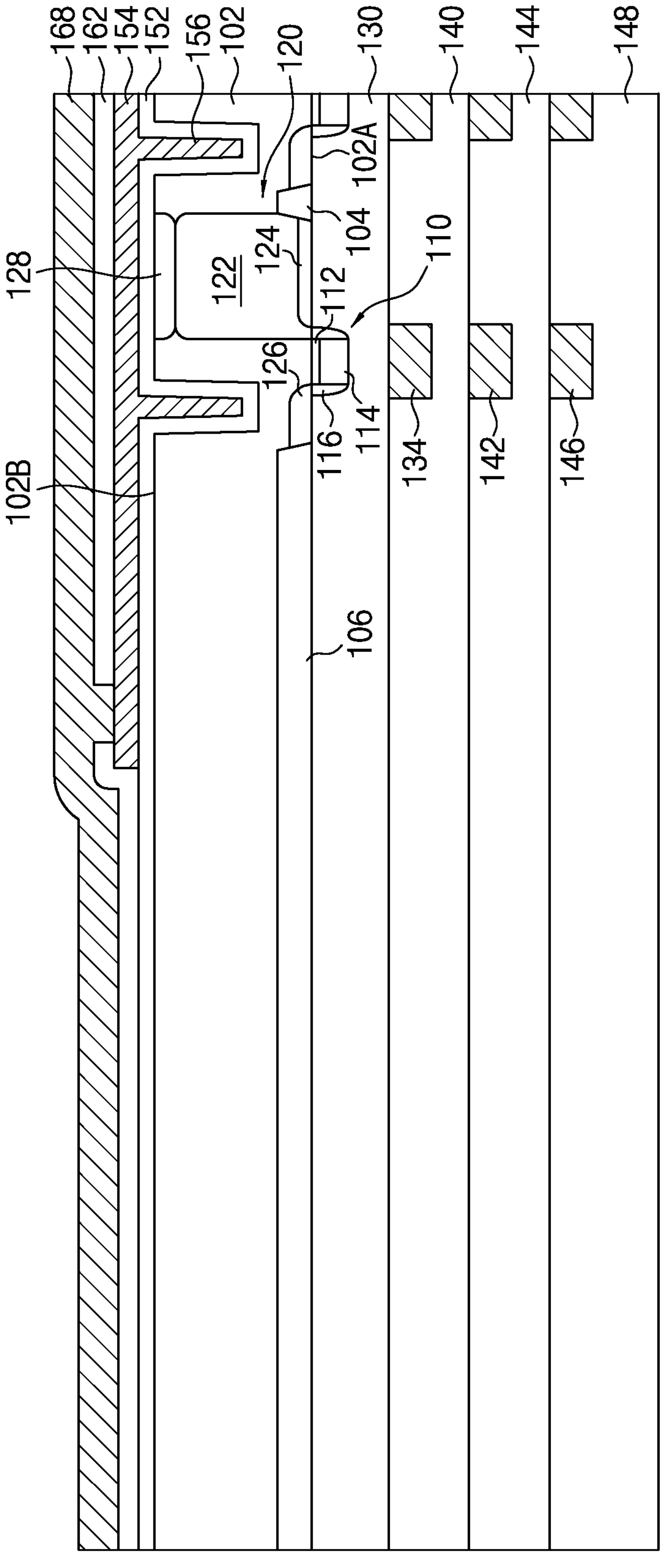

Referring to FIGS. 14 and 15, a second metal layer 168 may be formed on the backside insulating layer 162, the surface portions of the electrode pads 132 exposed by the second via holes 164, and the surface portions of the first metal layer 154 exposed by the third via holes 166. For example, the second metal layer 168 may be formed to have a uniform thickness through a sputtering process. In particular, the second metal layer 168 may be made of the same material as the electrode pads 132. For example, the second metal layer 168 may be made of aluminum.

Figure 16:
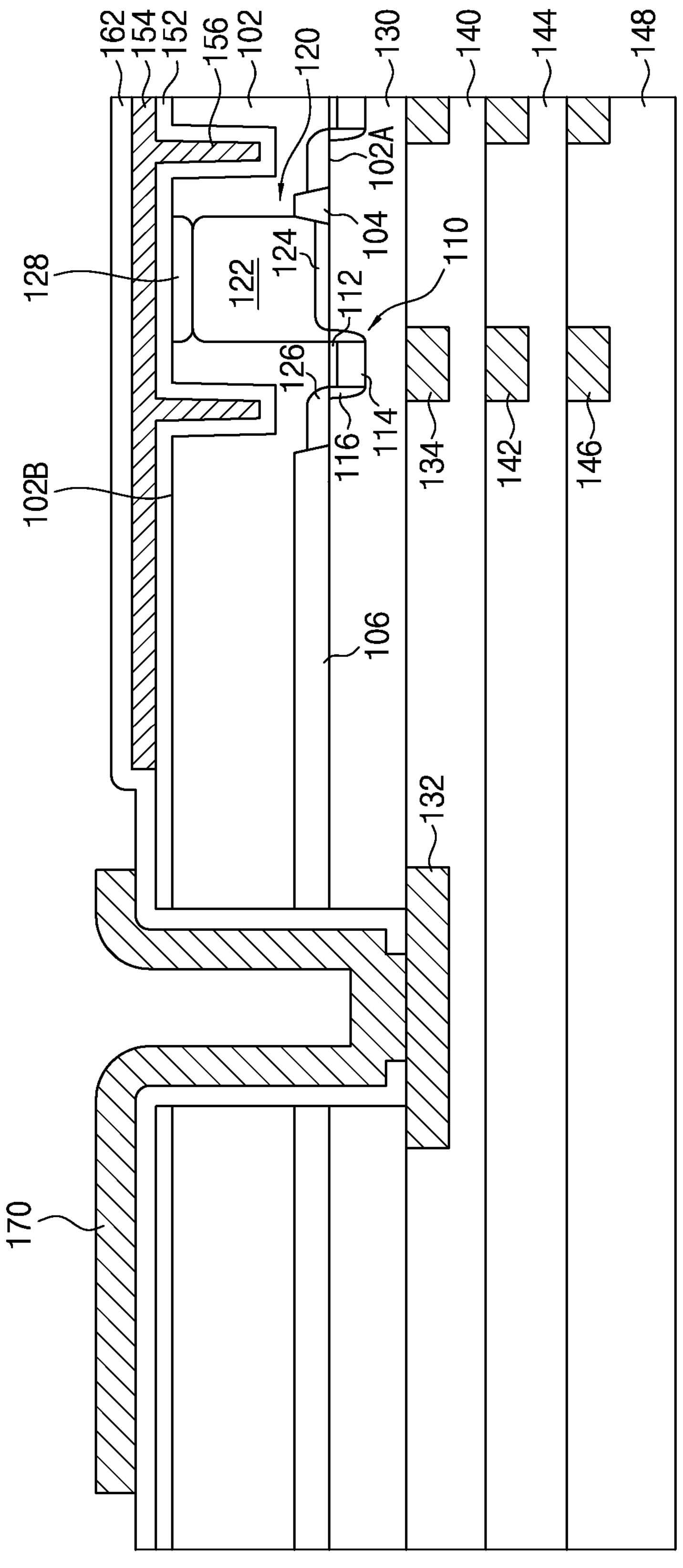
Figure 17:
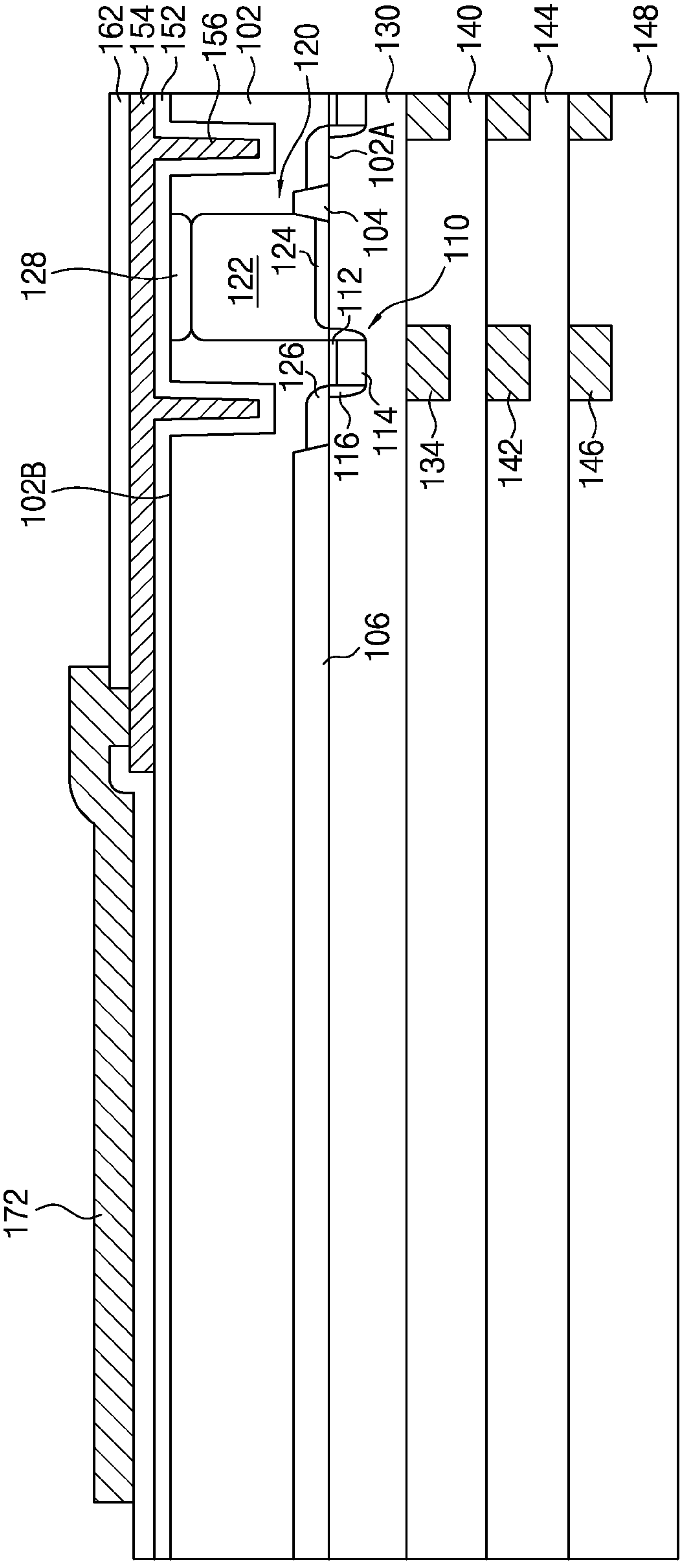

Referring to FIGS. 16 and 17, the second metal layer 168 may be patterned to form first bonding pads 170 connected to the electrode pads 132 and second bonding pads 172 connected to the first metal layer 154. For example, after forming a fifth photoresist pattern (not shown) exposing the remaining portions of the second metal layer 168 except for the first bonding pads 170 and the second bonding pads 172, an anisotropic etching process using the fifth photoresist pattern as an etching mask may be performed so as to form the first bonding pads 170 and the second bonding pads 172.

Figure 18:
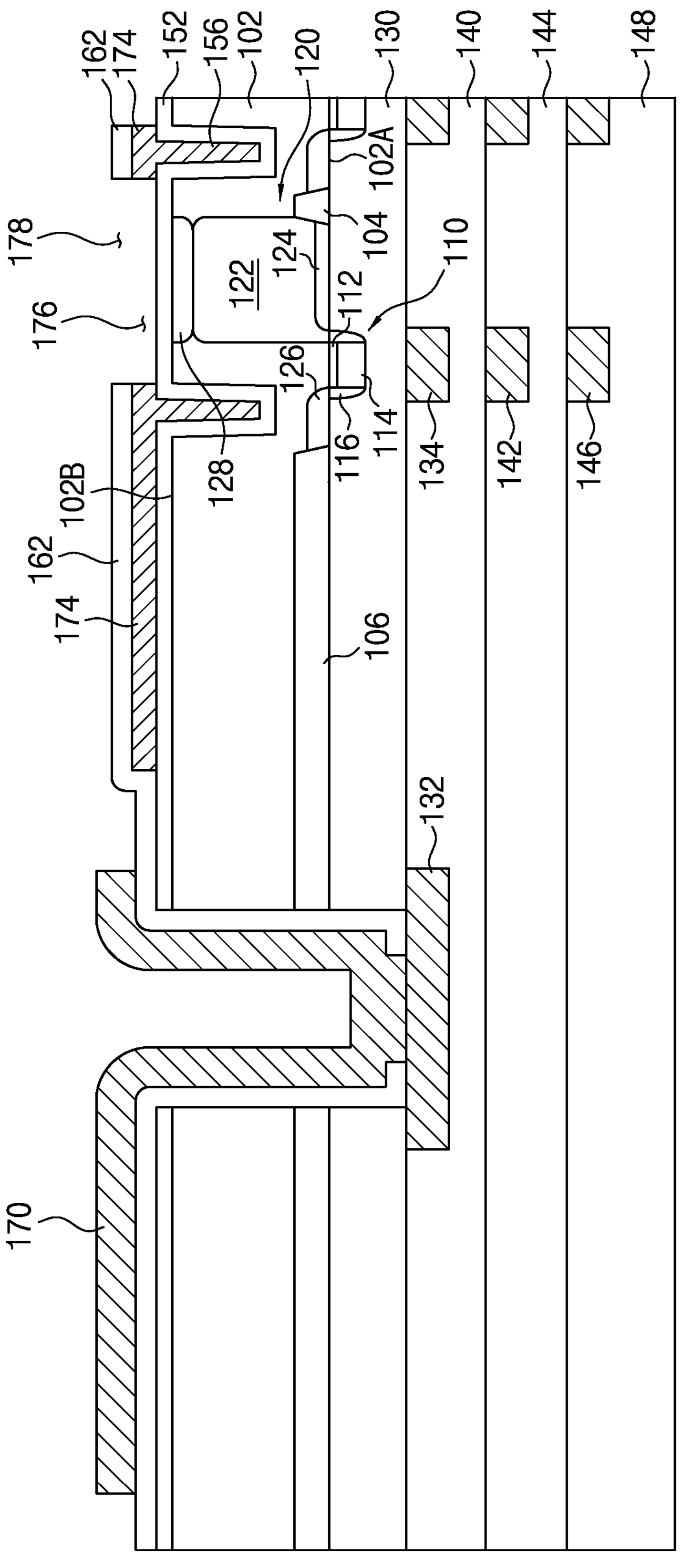
Figure 19:
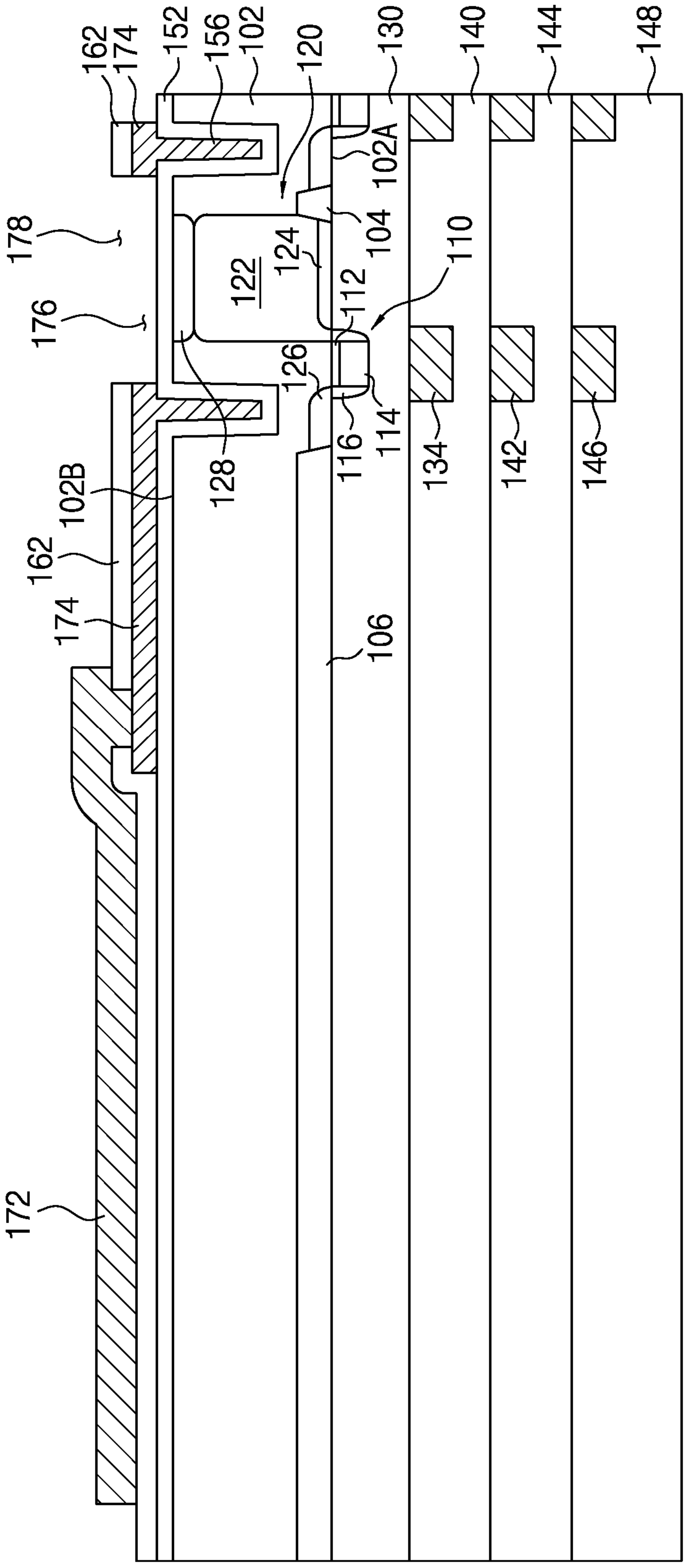

Referring to FIGS. 18 and 19, a light blocking pattern layer 174 having first openings 176 corresponding to the charge accumulation regions 122 may be formed by patterning the first metal layer 154. For example, after forming a sixth photoresist pattern (not shown) exposing portions of the backside insulating layer 162 corresponding to the charge accumulation regions 122, an anisotropic etching process using the sixth photoresist pattern as an etching mask may be performed so as to form the light blocking pattern layer 174. In such case, second openings 178 corresponding to the charge accumulation regions 122 may be formed through the backside insulating layer 162 by the anisotropic etching process. The anisotropic etching process may be performed until the anti-reflective layer 152 is exposed. After forming the light blocking pattern layer 170, the sixth photoresist pattern may be removed by an ashing process and/or a strip process.

Referring again to FIGS. 1 to 3, a passivation layer 180 may be formed on the first and second bonding pads 170 and 172, the backside insulating layer 162, inner side surfaces of the first and second openings 176 and 178, and surface portions of the anti-reflective layer 152 exposed by the first and second openings 176 and 178. For example, the passivation layer 180 may include silicon oxide and may be uniformly formed to a predetermined thickness through a chemical vapor deposition process.

Third openings 182 partially exposing the first and second bonding pads 170 and 172 may be formed by patterning the passivation layer 180. For example, after forming a seventh photoresist pattern (not shown) exposing surface portions of the passivation layer 180 corresponding to portions of the first and second bonding pads 170 and 172, an etching process using the seventh photoresist pattern as an etching mask may be performed so as to form the third openings 182. The seventh photoresist pattern may be removed by an ashing process and/or a strip process after forming the third openings 182.

Subsequently, a color filter layer 190 including color filters corresponding to the pixel regions 120 may be formed on the passivation layer 180, and a microlens array 192 may be formed on the color filter layer 190.

In accordance with the embodiments of the present disclosure as described above, the light isolation patterns 156 may be configured to surround the pixel regions 120, thereby significantly reducing leakage of light to adjacent pixel regions and significantly reducing crosstalk of the backside illuminated image sensor 100. In addition, a negative voltage may be applied to the light isolation patterns 156 through the second bonding pads 172, and accordingly, dark current of the backside illuminated image sensor 100 may be significantly reduced.

Although the example embodiments of the present disclosure have been described with reference to the specific embodiments, they are not limited thereto. Therefore, it will be readily understood by those skilled in the art that various modifications and changes can be made thereto without departing from the spirit and scope of the present disclosure defined by the appended claims.

The invention claimed is:

1. A backside illuminated image sensor comprising:

a substrate having a frontside surface and a backside surface;

pixel regions formed in the substrate;

light isolation patterns formed among the pixel regions and interconnected to surround the pixel regions;

first bonding pads electrically connected to the pixel regions; and a light blocking pattern formed along the backside surface of the substrate, the light blocking pattern being made of a same material as the light isolation patterns and integrally connected with the light isolation patterns, wherein the light blocking pattern is not in contact with the first bonding pads; and at least one second bonding pad directly contacting the light blocking pattern, electrically connected to the light isolation patterns through the light blocking pattern, and configured to apply a negative voltage to the light isolation patterns through the light blocking pattern, wherein the at least one second bonding pad is not in direct contact with the light isolation patterns.

2. The backside illuminated image sensor of claim 1, wherein the substrate has trenches formed among the pixel regions from the backside surface of the substrate toward the frontside surface of the substrate, and the light isolation patterns are formed in the trenches.

3. The backside illuminated image sensor of claim 2, wherein the trenches are connected with one another and arranged in a lattice form.

4. The backside illuminated image sensor of claim 3, wherein the light isolation patterns are connected with one another and arranged in a lattice form.

5. The backside illuminated image sensor of claim 2, further comprising:

an anti-reflective layer formed on the backside surface of the substrate and inner surfaces of the trenches.

6. The backside illuminated image sensor of claim 1, further comprising:

an insulating layer formed on the frontside surface of the substrate; and electrode pads formed on the insulating layer and electrically connected to the pixel regions, wherein the first bonding pads are connected to the electrode pads through via holes penetrating the substrate and the insulating layer.

7. The backside illuminated image sensor of claim 6, further comprising:

an anti-reflective layer formed on the backside surface of the substrate; and a backside insulating layer formed on the anti-reflective layer, inner side surfaces of the via holes and surface portions of the electrode pads exposed by the via holes, wherein the first bonding pads are formed on the backside insulating layer and connected to the electrode pads through the backside insulating layer.

* * * * *